(12) United States Patent
Lee et al.

(10) Patent No.: US 10,199,331 B2
(45) Date of Patent: Feb. 5, 2019

(54) FABRICATION METHOD OF ELECTRONIC PACKAGE HAVING EMBEDDED PACKAGE BLOCK

(71) Applicant: Siliconware Precision Industries Co., Ltd., Taichung (TW)

(72) Inventors: Meng-Tsung Lee, Taichung (TW); Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/883,808

(22) Filed: Jan. 30, 2018

(65) Prior Publication Data

US 2018/0158784 A1    Jun. 7, 2018

Related U.S. Application Data

(62) Division of application No. 14/983,049, filed on Dec. 29, 2015, now abandoned.

(30) Foreign Application Priority Data

Sep. 11, 2015 (TW) .............................. 104130064 A

(51) Int. Cl.
*H01L 23/60* (2006.01)
*H01L 21/56* (2006.01)
(Continued)

(52) U.S. Cl.
CPC ............ *H01L 23/552* (2013.01); *H01L 21/56* (2013.01); *H01L 23/31* (2013.01); *H01L 24/19* (2013.01); *H01L 24/20* (2013.01); *H01L 24/96* (2013.01); *H01L 25/105* (2013.01); *H01L 25/50* (2013.01); *H01L 21/561* (2013.01); *H01L 21/568* (2013.01); *H01L 23/3128* (2013.01); *H01L 2224/04105* (2013.01); *H01L 2224/12105* (2013.01); *H01L 2224/16227* (2013.01);
(Continued)

(58) Field of Classification Search
CPC ................ H01L 21/561; H01L 21/568; H01L 21/76834; H01L 21/76877; H01L 21/6835; H01L 21/76802; H01L 24/19; H01L 24/96; H01L 23/552
See application file for complete search history.

(56) References Cited

U.S. PATENT DOCUMENTS

2005/0211465 A1    9/2005  Sunohara et al.
2015/0001731 A1*   1/2015  Shuto ................... H01L 23/562
                                                       257/774

(Continued)

*Primary Examiner* — Changhyun Yi
(74) *Attorney, Agent, or Firm* — Mintz Levin Cohn Ferris Glovsky and Popeo, P.C.; Peter F. Corless; Steven M. Jensen

(57) ABSTRACT

A method for fabricating an electronic package is provided, including steps of: providing a carrier having at least an electronic element and at least a package block disposed thereon, wherein the package block has a plurality of conductive posts bonded to the carrier; forming an encapsulant on the carrier for encapsulating the electronic element and the package block; and removing the carrier so as to expose the electronic element and the conductive posts from a surface of the encapsulant. As such, the invention dispenses with formation of through holes in the encapsulant for forming the conductive posts as in the prior art, thereby saving the fabrication cost.

10 Claims, 7 Drawing Sheets

(51) Int. Cl.
*H01L 23/552* (2006.01)
*H01L 23/00* (2006.01)
*H01L 25/10* (2006.01)
*H01L 25/00* (2006.01)
*H01L 23/31* (2006.01)

(52) U.S. Cl.
CPC ........... *H01L 2224/24137* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2225/1035* (2013.01); *H01L 2225/1041* (2013.01); *H01L 2225/1058* (2013.01); *H01L 2924/15311* (2013.01); *H01L 2924/18162* (2013.01); *H01L 2924/19041* (2013.01); *H01L 2924/19042* (2013.01); *H01L 2924/19043* (2013.01)

(56) References Cited

U.S. PATENT DOCUMENTS

| | | |
|---|---|---|
| 2015/0028477 A1 | 1/2015 | Jung et al. |
| 2015/0348936 A1* | 12/2015 | Lin .................. H01L 23/552 257/659 |
| 2017/0271277 A1 | 9/2017 | Shuto |

* cited by examiner

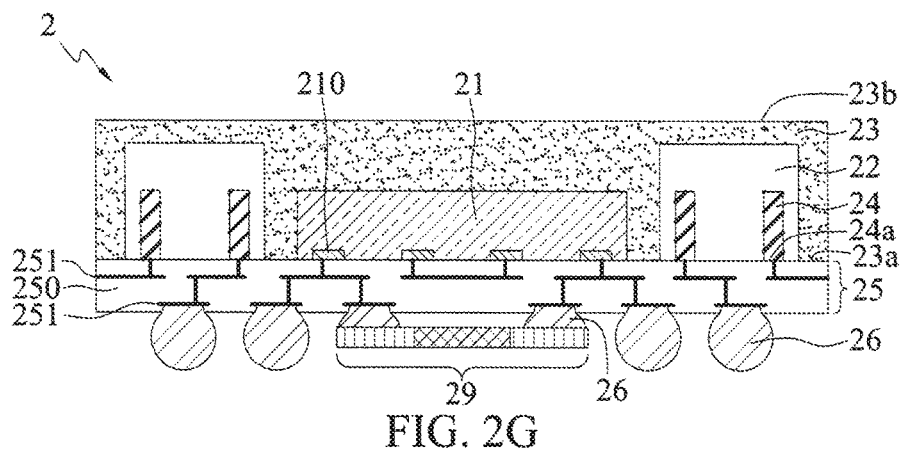
FIG. 2G
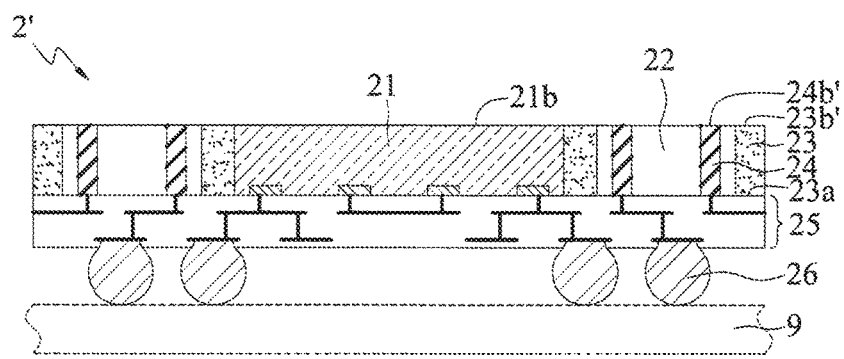
FIG. 2G'
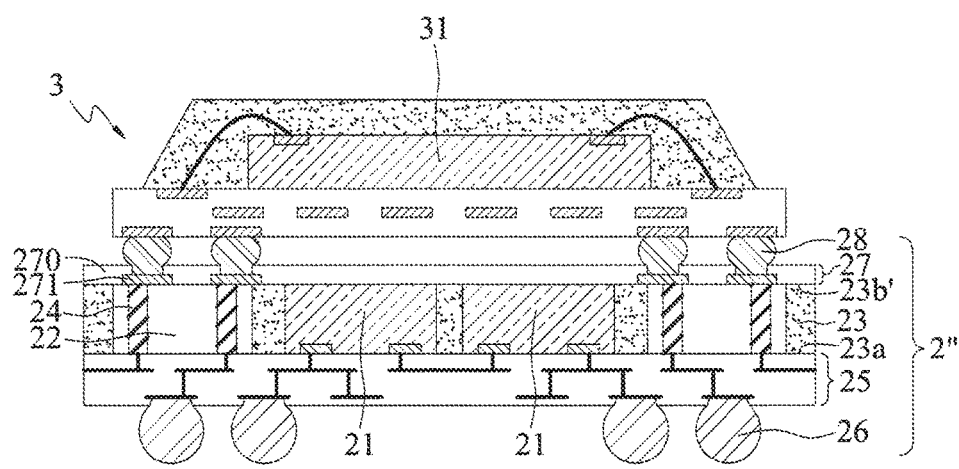
FIG. 2G"

FABRICATION METHOD OF ELECTRONIC PACKAGE HAVING EMBEDDED PACKAGE BLOCK

CROSS-REFERENCE TO RELATED APPLICATION(S)

This application is a divisional of copending application U.S. Ser. No. 14/983,049, filed on Dec. 29, 2015, which claims under 35 U.S.C. § 119(a) the benefit of Taiwanese Application No. 104130064, filed Sep. 11, 2015, the entire contents of which are incorporated herein by reference.

BACKGROUND OF THE INVENTION

1. Field of the Invention

The present invention relates to packaging processes, and more particularly, to an electronic package having an electronic element embedded therein and a fabrication method thereof.

2. Description of Related Art

Along with the progress of semiconductor packaging technologies, various package types have been developed for semiconductor devices. To improve electrical performance and save space, a plurality of packages can be stacked to form a package on package (PoP) structure, for example, a fan out package on package (FO PoP) structure, thereby greatly increasing I/O count and integrating integrated circuits having different functions. Such a packaging method allows merging of heterogeneous technologies in a system-in-package (SiP) so as to systematically integrate a plurality of electronic elements having different functions, such as a memory, a CPU (Central Processing Unit), a GPU (Graphics Processing Unit), an image application processor and so on, and therefore is applicable to various thin type electronic products.

FIGS. 1A to 1F are schematic cross-sectional views showing a method for fabricating a semiconductor package 1 of a PoP structure according to the prior art.

Referring to FIG. 1A, a semiconductor element 10 such as a chip is disposed on a release layer 110 of a first carrier 11, and then an encapsulant 13 is formed on the release layer 110 to encapsulate the semiconductor element 10.

Referring to FIG. 1B, a second carrier 12 having a copper foil 120 is disposed on the encapsulant 13.

Referring to FIG. 1C, the first carrier 11 and the release layer 110 are removed to expose the electronic element 10 and the encapsulant 13.

Referring to FIG. 1D, a plurality of through holes 130 are formed by laser drilling in the encapsulant 13 around a periphery of the electronic element 10.

Referring to FIG. 1E, a conductive material is filled in the through holes 130 to form a plurality of conductive posts 14. Further, a plurality of redistribution layers (RDLs) 15 are formed on the encapsulant 13 and electrically connected to the conductive posts 14 and the electronic element 10.

Referring to FIG. 1F, the second carrier 12 is removed and a patterning process is performed on the copper foil 120 to form a circuit structure 16. Then, a singulation process is performed to obtain an electronic package 1.

However, the laser drilling process for forming the through holes 130 can easily destroy the copper foil 120 and consequently adversely affect the quality of the circuit structure 16. Further, the laser drilling process is quite slow and time-consuming, especially when the number of the through holes is large. Furthermore, residue (generated from such as the encapsulant 13 or the copper material) easily accumulates on the bottom of the through holes 130. Accordingly, a cleaning process is required before filling of the conductive material in the through holes 130, thus increasing the number of fabrication steps and the fabrication cost.

In addition, if the through holes 130 have a high aspect ratio, it will become difficult to completely remove the residue in the through holes 130. As such, the electrical transmission performance of the conductive posts 14 may be adversely affected by the remaining residue.

Further, the laser drilling process results in uneven wall surfaces of the through holes 130. As such, during a subsequent electroplating process, the conductive material cannot be effectively attached to the wall surfaces of the through holes 130 and easily delaminates therefrom, thus reducing the product reliability of the semiconductor package 1.

Also, a laser beam used in the laser drilling process produces a heat affected zone. That is, if the position of the through holes 130 is close to the semiconductor element 10, high heat from the laser beam will damage the semiconductor element 10. Therefore, a certain distance must be kept between the conductive posts 14 and the semiconductor element 10, thus hindering miniaturization of the semiconductor package 1.

Therefore, there is a need to provide an electronic package and a fabrication method thereof so as to overcome the above-described drawbacks.

SUMMARY OF THE INVENTION

In view of the above-described drawbacks, the present invention provides an electronic package, which comprises: an encapsulant having a first surface and a second surface opposite to the first surface; at least an electronic element embedded in the encapsulant and exposed from the first surface of the encapsulant; and at least a package block embedded in the encapsulant and having at least one conductive post exposed from the first surface of the encapsulant.

The present invention further provides a method for fabricating an electronic package, which comprises the steps of: providing a carrier having at least an electronic element and at least a package block disposed thereon, wherein the package block has at least one conductive post bonded to the carrier; forming an encapsulant on the carrier for encapsulating the electronic element and the package block, wherein the encapsulant has a first surface and a second surface opposite to the first surface; and removing the carrier so as to expose the electronic element and the conductive posts from the first surface of the encapsulant.

In the above-described method, fabricating the package block can comprise: providing a metal board having at least one conductive post thereon; forming an encapsulant on the metal board to encapsulate the conductive post; and removing the metal board, thereby forming the package block having the conductive post exposed from a surface thereof.

In the above-described method, the encapsulant can be formed by molding or lamination.

In the above-described package and method, the encapsulant and the package block can be made of the same or different materials.

In the above-described package and method, the electronic element can further be exposed from the second surface of the encapsulant.

In the above-described package and method, a shielding layer can be formed on the electronic element. For example, the shielding layer is exposed from the second surface of the encapsulant.

In the above-described package and method, the conductive post can further be exposed from the second surface of the encapsulant. Furthermore, a circuit structure can be on formed on the second surface of the encapsulant and electrically connected to the conductive post.

In the above-described package and method, a circuit structure can further be formed on the first surface of the encapsulant and electrically connected to the electronic element and the conductive post.

According to the present invention, the package block having the conductive post are fabricated first and then the encapsulant is formed to encapsulate the package block. As such, the present invention dispenses with the conventional processes for forming the conductive post in the encapsulant, for example, a laser drilling process for forming through holes in the encapsulant, a cleaning process for cleaning the through holes, and an electroplating process for filling the through holes with a conductive material. Therefore, the present invention saves the fabrication time, improves the electrical transmission performance of the conductive posts and avoids the conventional drawback of delamination of the conductive posts from uneven wall surfaces of the through holes, thereby improving the reliability of the electronic package.

Further, by dispensing with the laser drilling process, the present invention avoids formation of a heat affected zone and hence allows the conductive posts or the package block to be positioned close to the electronic element according to the practical need. Therefore, the size of the electronic package can be reduced to meet the miniaturization requirement.

BRIEF DESCRIPTION OF DRAWINGS

FIGS. 2A to 2G are schematic cross-sectional views showing a method for fabricating an electronic package according to the present invention, wherein FIG. 2D' is a schematic upper view of FIG. 2D, FIGS. 2F' and 2F" show other embodiments of FIG. 2F, and FIGS. 2G' and 2G" show other embodiments of FIG. 2G.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2G are schematic cross-sectional views showing a method for fabricating an electronic package 2 according to the present invention.

Figure 1A:
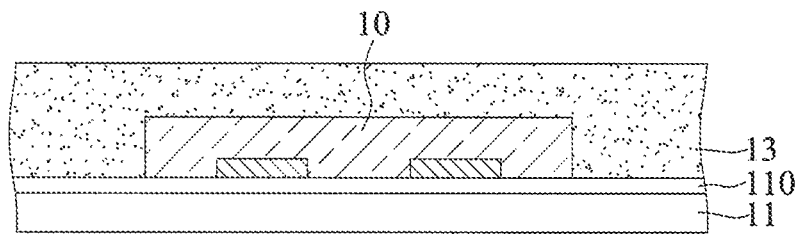
FIGS. 1A and 1F are schematic cross-sectional views showing a method for fabricating a semiconductor package according to the prior art.
Figure 1B:
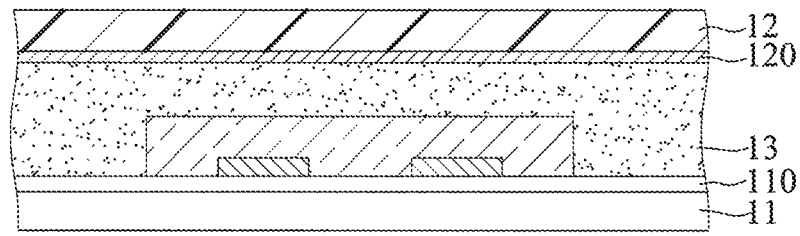
Figure 1C:
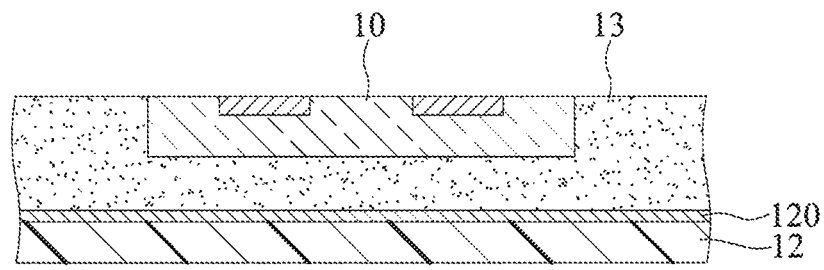
Figure 1D:
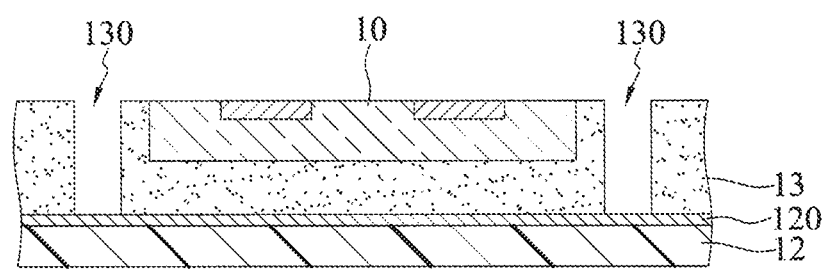
Figure 1E:
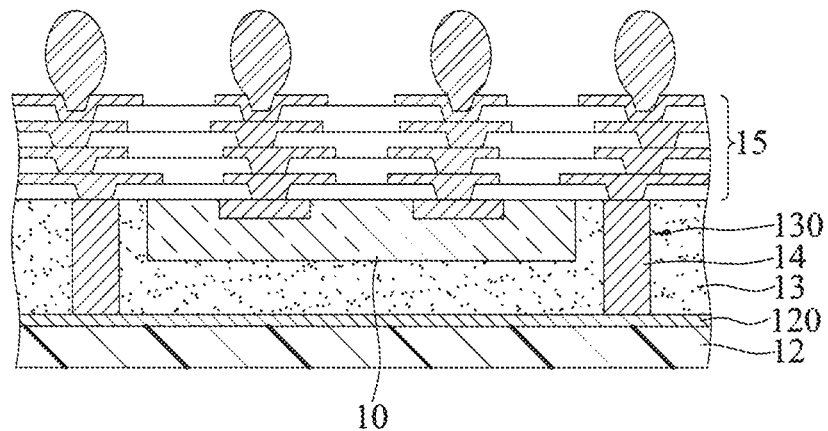
Figure 1F:
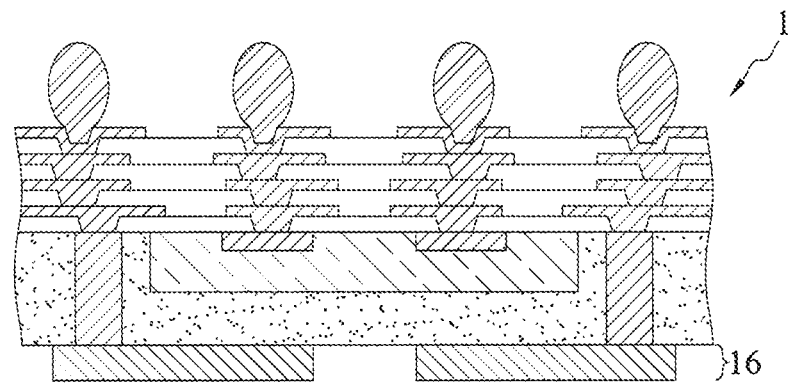
Figure 2A:
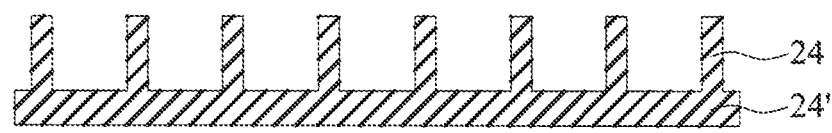

Referring to FIG. 2A, a metal board 24' having a plurality of conductive posts 24 thereon is provided.

In the present embodiment, the metal board 24' and the conductive posts 24 are integrally formed. For example, a copper substrate is patterned by laser, mechanical drilling, etching or the like so as to form the metal board 24' having the conductive posts 24.

In other embodiments, the metal board 24' and the conductive posts 24 are not integrally formed. For example, the conductive posts 24 are formed on the metal board 24' by electroplating.

Figure 2B:
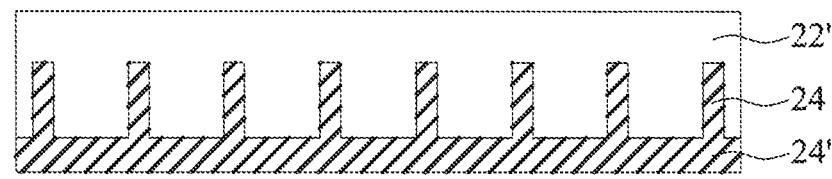

Referring to FIG. 2B, an encapsulant 22' is formed on the metal board 24' to encapsulate the conductive posts 24.

In the present embodiment, the encapsulant 22' is formed by, for example, resin molding, dry film lamination, coating or printing.

Figure 2C:
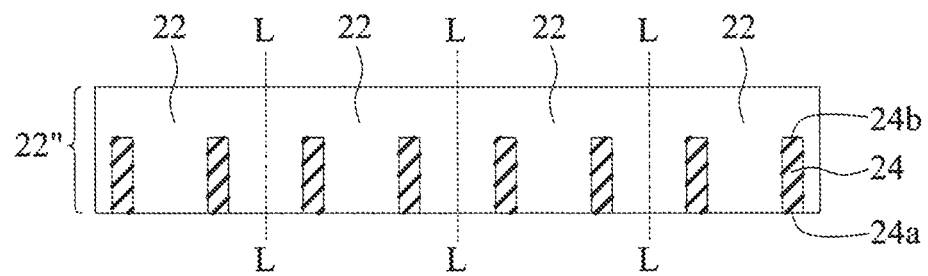

Referring to FIG. 2C, the metal board 24' is removed, thereby forming a package block 22".

In the present embodiment, each of the conductive posts 24 has a first end surface 24a flush with and exposed from a surface of the package block 22" and a second end surface 24b opposite to the first end surface 24a.

According to the practical need, the package block 22" can be cut along cutting paths L so as to obtain a plurality of small-sized package blocks 22.

Figure 2D:
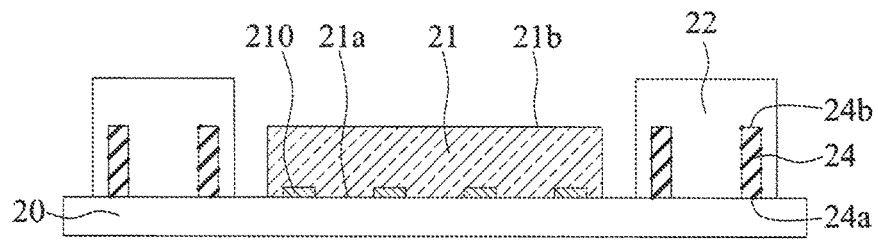
Figure 2D:
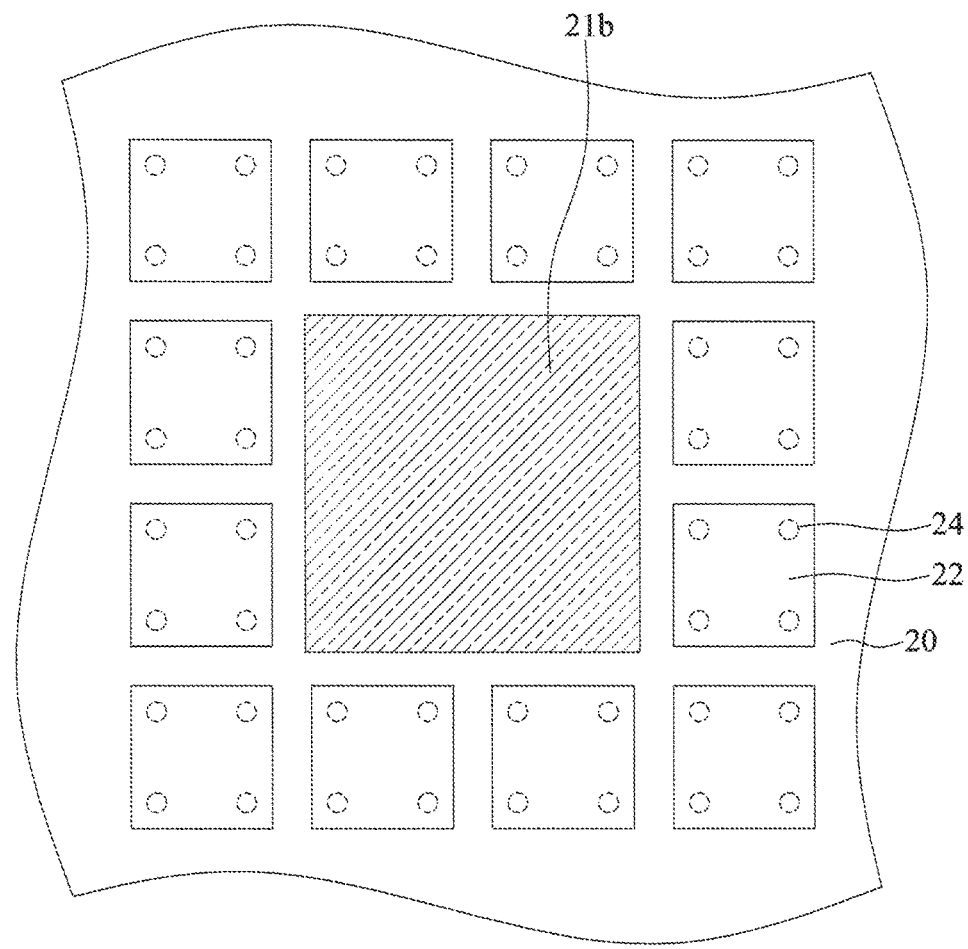

Referring to FIG. 2D, an electronic element 21 and a plurality of package blocks 22 are disposed on a carrier 20 with the conductive posts 24 bonded to the carrier 20.

In the present embodiment, the carrier 20 is a board made of, for example, a semiconductor material, a dielectric material, a ceramic material, glass or metal. The carrier 20 can correspond in size to a wafer type substrate or a panel type substrate.

A bonding layer (not shown) made of such as a release film, an adhesive material or an insulating material can be formed on the carrier 20 by coating or adhering for bonding with the electronic element 21 and the package blocks 22, and the first end surfaces 24a of the conductive posts 24 are in contact with the bonding layer.

The electronic element 21 is an active element such as a semiconductor chip, a passive element such as a resistor, a capacitor or an inductor, or a combination thereof. In particular, the electronic element 21 has an active surface 21a with a plurality of electrode pads 210 and a non-active surface 21b opposite to the active surface 21a, and the electronic element 21 is bonded to the bonding layer via the active surface 21a thereof.

Referring to FIG. 2D', the package blocks 22 are arranged adjacent to the electronic element 21.

Figure 2E:
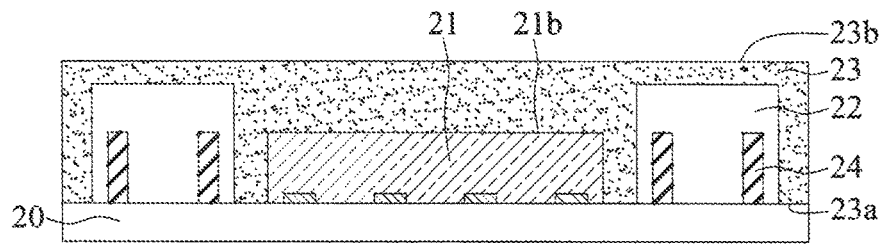

Referring to FIG. 2E, an encapsulant 23 is formed on the carrier 20 to encapsulate the electronic element 21 and the package blocks 22.

In the present embodiment, the encapsulant 23 has a first surface 23a and a second surface 23b opposite to the first surface 23a, and the encapsulant 23 is bonded to the bonding layer of the carrier 20 via the first surface 23a thereof.

The encapsulant 23 covers the non-active surface 21b of the electronic element 21 and the upper portions of the package blocks 22.

The encapsulant 23 is made of an insulating material such as a liquid compound, and formed by injection, lamination or molding.

The encapuslant 23 and the package blocks 22 can be made of the same or different materials.

Figure 2F:
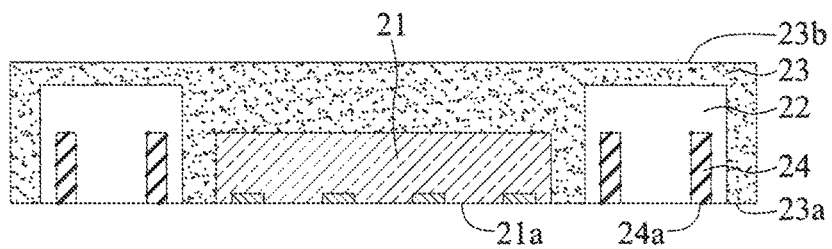
Figure 2F:
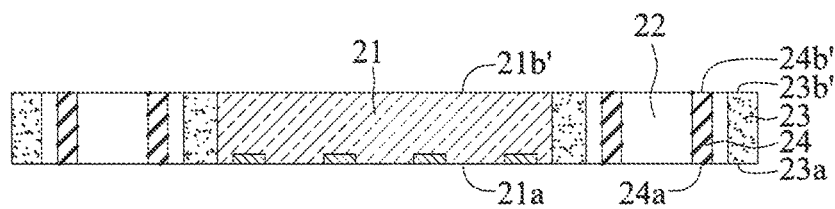
Figure 2F:
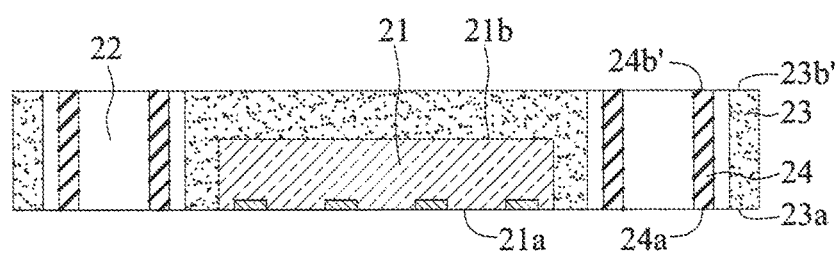

Referring to FIG. 2F, the carrier 20 and the bonding layer are removed to expose the first surface 23a of the encapsulant 23 and the package blocks 22. As such, the active surface 21a of the electronic element 21 and the first end surfaces 24a of the conductive posts 24 are exposed from the first surface 23a of the encapsulant 23.

Further, a thinning process can be performed according to the practical need. Referring to FIG. 2F', a thinning process is performed on the second surface 23b of the encapsulant 23 so as to expose a non-active surface 21b' of the electronic element 21 and second end surfaces 24b' of the conductive posts 24 from a second surface 23b' of the encapsulant 23. Alternatively, referring to FIG. 2F'', only the second end surfaces 24b' of the conductive posts 24 are exposed from the second surface 23b' of the encapsulant 23.

Referring to FIG. 2G, continued from FIG. 2F, a first circuit structure 25 is formed on the first surface 23a of the encapsulant 23 and electrically connected to the electrode pads 210 of the electronic element 21 and the first end surfaces 24a of the conductive posts 24. Thereafter, a singluation process can be performed according to the practical need.

In the present embodiment, the first circuit structure 25 has an insulating body 250 made of, for example, a dielectric material or a solder mask material, and at least a redistribution layer 251 embedded in the insulating body 250. The innermost redistribution layer 251 is electrically connected to the electrode pads 210 of the electronic element 21 and the conductive posts 24, and a plurality of conductive elements 26 made of such as metal posts or a solder material are formed on the outermost redistribution layer 251 for mounting another electronic element 29 such as a passive element. Alternatively, referring to FIG. 2G', an electronic device 9 such as a circuit board is mounted on the conductive elements 26.

If the process is continued from FIG. 2F', an electronic package 2' of FIG. 2G' is obtained.

In another embodiment, referring to FIG. 2G'', the encapsulant 23 encapsulates a plurality of electronic elements 21, and a second circuit structure 27 is formed on the second surface 23b' of the encapsulant 23 and electrically connected to the conductive posts 24. The second circuit structure 27 has an insulating body 270 made of, for example, a dielectric material or a solder mask material, and at least a redistribution layer 271 electrically connected to the conductive posts 24. Further, a plurality of conductive elements 28 made of such as metal posts or a solder material are formed on the redistribution layer 271.

Subsequently, an electronic device is stacked on the second surface 23b, 23b' of the encapsulant 23 so as to form a stack-type package structure. In particular, referring to FIG. 2G'', an electronic device 3 is disposed on the electronic package 2'' through the conductive elements 28 on the second circuit structure 27.

In the present embodiment, the electronic device 3 is a package, a chip or a substrate. The electronic device 3 can have a wire-bonding type chip 31 or a flip-chip type chip.

Figure 3:
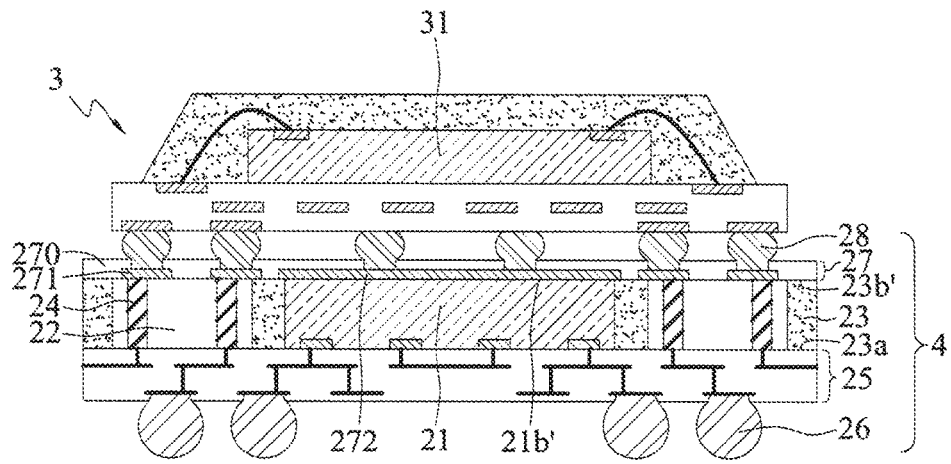
FIGS. 3 and 3' are schematic cross-sectional views showing other embodiments of FIG. 2G".
Figure 3:
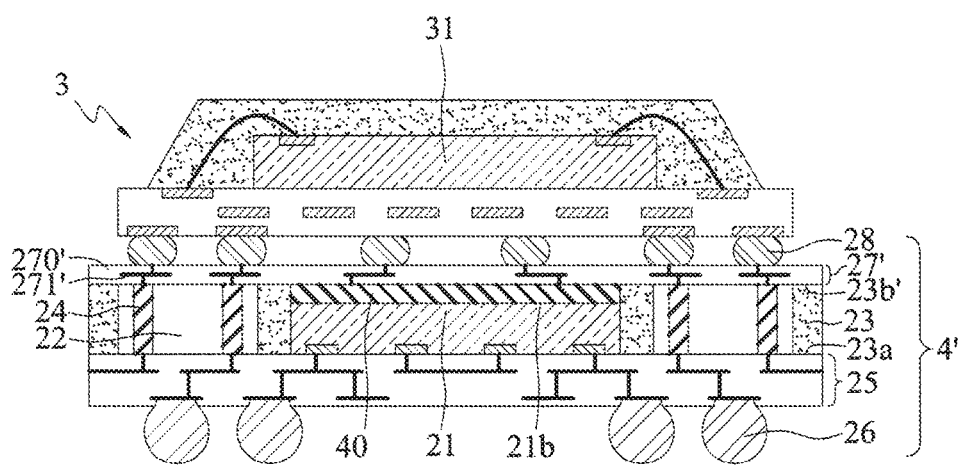

In an embodiment, referring to FIG. 3, the non-active surface 21b' of the electronic element 21 is exposed from the second surface 23b' of the encapsulant 23, and a shielding layer 272 is formed on the non-active surface 21b' of the electronic element 21 during formation of the redistribution layer 271 of the second circuit structure 27. The shielding layer 272 is electrically grounded through a portion of the redistribution layer 271 for EMI (electromagnetic interference) shielding.

In another embodiment, referring to FIG. 3', a metal sheet is disposed on the non-active surface 21b of the electronic element 21 to serve as a shielding layer 40, and the shielding layer 40 is flush with and exposed from the second surface 23b' of the encapsulant 23. Then, a second circuit structure 27' is formed on the second surface 23b' of the encapsulant 23 and electrically connected to the conductive posts 24. For example, the circuit structure 27' has an insulating body 270' made of such as a dielectric material or a solder mask material and a plurality of redistribution layers 271' electrically connected to the conductive posts 24, and the shielding layer 40 is electrically grounded through a portion of the redistribution layers 271'.

According to the present invention, the package blocks 22 having the conductive posts 24 are fabricated first and then the encapsulant 23 is formed to encapsulate the package blocks 22. As such, the present invention dispenses with the conventional processes for forming the conductive posts in the encapsulant, for example, a laser drilling process for forming through holes in the encapsulant, a cleaning process for cleaning the through holes, and an electroplating process for filling the through holes with a conductive material. Therefore, the present invention saves the fabrication time, improves the electrical transmission performance of the conductive posts 24 and avoids the conventional drawback of delamination of the conductive posts 24 from uneven wall surfaces of the through holes, thereby improving the reliability of the electronic package 2, 2', 2'', 4, 4'.

Further, by dispensing with the laser drilling process, the present invention avoids formation of a heat affected zone and hence allows the conductive posts 24 or the package blocks 22 to be positioned close to the electronic element 21 according to the practical need. Therefore, the size of the electronic package 2, 2', 2'', 4, 4' can be reduced to meet the miniaturization requirement.

The present invention further provides an electronic package 2, 2', 2'', 4, 4', which has: an encapsulant 23 having a first surface 23a and a second surface 23b, 23b' opposite to the first surface 23a; at least an electronic element 21 embedded in the encapsulant 23 and exposed from the first surface 23a of the encapsulant 23; and at least a package block 22 embedded in the encapsulant 23 and having a plurality of conductive posts 24 exposed from the first surface 23a of the encapsulant 23.

In an embodiment, an active surface 21a of the electronic element 21 is flush with the first surface 23a of the encapsulant 23.

In an embodiment, each of the conductive posts 24 has a first end surface 24a flush with the first surface 23a of the encapsulant 23 and a second end surface 24b, 24b' opposite to the first end surface 24a.

In an embodiment, the encapsulant 23 and the package block 22 are made of the same or different materials.

In an embodiment, the electronic element 21 is further exposed from the second surface 23b' of the encapsulant 23. For example, a non-active surface 21b' of the electronic element 21 is flush with the second surface 23b' of the encapsulant 23.

In an embodiment, a shielding layer 272, 40 is formed on the non-active surface 21b, 21b' of the electronic element 21 and exposed from the second surface 23b' of the encapsulant 23.

In an embodiment, the conductive posts 24 are further exposed from the second surface 23b' of the encapsulant 23. For example, the second end surfaces 24b' of the conductive posts 24 are flush with the second surface 23b' of the encapsulant 23. Further, a second circuit structure 27, 27' is formed on the second surface 23b' of the encapsulant 23 and electrically connected to the conductive posts 24.

In an embodiment, a first circuit structure 25 is further formed on the first surface 23a of the encapsulant 23 and electrically connected to the electronic element 21 and the conductive posts 24. For example, the first circuit structure 25 has at least a redistribution layer 251 electrically connected to the electronic element 21 and the conductive posts 24.

According to the present invention, the package block having the conductive posts are fabricated first and then the encapsulant is formed to encapsulate the package block. Therefore, the present invention dispenses with the conventional laser drilling process so as to simplify the fabrication process, reduce the fabrication time and cost, improve the reliability of the electronic package and reduce the size of the electronic package.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating an electronic package, comprising the steps of:
    providing a metal board having at least one conductive post thereon;
    forming a first encapsulant on the metal board to encapsulate the conductive post; and
    removing the metal board to form at least a package block having the conductive post exposed from a surface thereof;
    disposing at least an electronic element and the package block on a carrier, wherein the conductive post is bonded to the carrier;
    forming a second encapsulant on the carrier for encapsulating the electronic element and the package block, wherein the second encapsulant has a first surface and a second surface opposite to the first surface; and
    removing the carrier so as to expose the electronic element and the conductive post from the first surface of the second encapsulant.

2. The method of claim 1, wherein the second encapsulant is formed by molding or lamination.

3. The method of claim 1, wherein the first and second encapsulants are made of the same material.

4. The method of claim 1, wherein the electronic element is further exposed from the second surface of the second encapsulant.

5. The method of claim 1, wherein a shielding layer is formed on the electronic element.

6. The method of claim 5, wherein the shielding layer is exposed from the second surface of the second encapsulant.

7. The method of claim 1, wherein the conductive post is further exposed from the second surface of the second encapsulant.

8. The method of claim 7, further comprising forming on the second surface of the second encapsulant a circuit structure electrically connected to the conductive post.

9. The method of claim 1, further comprising forming on the first surface of the second encapsulant a circuit structure electrically connected to the electronic element and the conductive post.

10. The method of claim 1, wherein the first and second encapsulants are made of different materials.

* * * * *